(12) United States Patent
De Vries et al.

(10) Patent No.: US 8,724,081 B2
(45) Date of Patent: May 13, 2014

(54) LITHOGRAPHIC APPARATUS AND METHOD

(75) Inventors: Gosse Charles De Vries, Veldhoven (NL); Edwin Johan Buis, Belfeld (NL)

(73) Assignee: ASML Netherlands B.V., Veldhoven (NL)

( * ) Notice: Subject to any disclaimer, the term of this patent is extended or adjusted under 35 U.S.C. 154(b) by 500 days.

(21) Appl. No.: 13/034,161

(22) Filed: Feb. 24, 2011

(65) Prior Publication Data

US 2011/0205516 A1     Aug. 25, 2011

Related U.S. Application Data

(60) Provisional application No. 61/307,965, filed on Feb. 25, 2010.

(51) Int. Cl.
G03B 27/42     (2006.01)

(52) U.S. Cl.
USPC ............... 355/53; 355/30; 355/55; 355/67

(58) Field of Classification Search
USPC .......................... 355/53, 30, 55, 67
See application file for complete search history.

(56) References Cited

U.S. PATENT DOCUMENTS

2005/0116165 A1* 6/2005 Kienle et al. ............ 250/311
2008/0204682 A1* 8/2008 Uehara et al. ............. 355/46

* cited by examiner

*Primary Examiner* — Steven H Whitesell Gordon
*Assistant Examiner* — Mesfin T Asfaw
(74) *Attorney, Agent, or Firm* — Pillsbury Winthrop Shaw Pittman LLP

(57) ABSTRACT

A lithographic apparatus includes an illumination system configured to condition a radiation beam and a support constructed to support a patterning device. The patterning device is configured to form a patterned radiation beam. A substrate table is constructed to hold a substrate, and a projection system is configured to project the patterned radiation beam onto a target portion of the substrate. The apparatus includes a heater arrangement that includes an electron beam generator configured to generate an electron beam, and an electron beam guide arrangement configured to guide the electron beam onto an optical element of the lithographic apparatus. The optical element forms a part of the illumination system or the projection system which, in use, is traversed by the radiation beam. The heater arrangement is controllable to provide a distribution of heat on the optical element by deflection of the electron beam.

15 Claims, 3 Drawing Sheets

LITHOGRAPHIC APPARATUS AND METHOD

CROSS-REFERENCE TO RELATED APPLICATIONS

This application claims the benefit of priority from U.S. Provisional Patent Application No. 61/307,965, filed Feb. 25, 2010, the entire content of which is incorporated herein by reference.

FIELD

The present invention relates to a lithographic apparatus and method.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing (i.e. pattern application) can be given by the Rayleigh criterion for resolution as shown in equation (1):

$$CD = k_1 * \frac{\lambda}{NA} \quad (1)$$

where $\lambda$ is the wavelength of the radiation used, NA is the numerical aperture of the projection system used to print (i.e. apply) the pattern, $k_1$ is a process dependent adjustment factor, also called the Rayleigh constant, and CD is the feature size (or critical dimension) of the printed (i.e. applied) feature. It follows from equation (1) that reduction of the minimum printable (i.e. applicable) size of features can be obtained in three ways: by shortening the exposure wavelength $\lambda$, by increasing the numerical aperture NA or by decreasing the value of $k_1$.

In order to shorten the exposure wavelength and, thus, reduce the minimum printable (i.e. applicable) feature size, it has been proposed to use an extreme ultraviolet (EUV) radiation source. EUV radiation is electromagnetic radiation having a wavelength within the range of 5-20 nm, for example within the range of 13-14 nm, or for example within the range of 5-10 nm such as 6.7 nm or 6.8 nm. Possible sources include, for example, laser-produced plasma (LPP) sources, discharge plasma (DPP) sources, or sources based on synchrotron radiation provided by an electron storage ring.

EUV radiation may be produced using a plasma. A radiation system for producing EUV radiation may include a laser for exciting a fuel to provide the plasma, and a source collector module for containing the plasma. The plasma may be created, for example, by directing a laser beam at a fuel, such as particles of a suitable material (e.g. tin), or a stream of a suitable gas or vapor, such as Xe gas or Li vapor. The resulting plasma emits output radiation, e.g., EUV radiation, which is collected using a radiation collector. The radiation collector may be a mirrored normal incidence radiation collector, which receives the radiation and focuses the radiation into a beam. The source collector module may include an enclosing structure or chamber arranged to provide a vacuum environment to support the plasma. Such a radiation system is typically termed a laser produced plasma (LPP) source.

In a lithographic apparatus, a radiation beam used to apply patterns to a substrate will traverse (e.g. reflect off, pass through, be refracted by, and the like) one or more optical elements (e.g. lenses or mirrors). Such optical elements may be present in an illumination system of the lithographic apparatus in order to condition the radiation beam. Alternatively or additionally, such optical elements may be present in the projection system of the lithographic apparatus that is used to project the radiation beam onto a substrate. These optical elements will not be perfectly transmissive or reflective with respect to the radiation beam, and this will result in heating of the optical elements as the radiation beam traverses them. This is particularly true of EUV lithographic apparatus at the present time. This is because EUV lithographic apparatus employ mirrors as the optical elements of the illumination system and projection system, and these mirrors have a relatively low reflectivity resulting in correspondingly high heat absorption. The same or similar problems may also be encountered in other forms of lithographic apparatus that use radiation other than EUV radiation.

Heat absorption by an optical element can cause deformation of the optical element. Such deformation is more likely to occur, or is likely to be more pronounced or exaggerated, when the radiation beam is not uniformly distributed across the optical element, such as for example when the radiation beam forms a quadruple or dipole illumination mode. This is because the heating, and thus the deformation, may occur more locally in the region of the poles forming the illumination mode. Deformation of the optical element can be detrimental to the optical performance of the optical element which may, in turn, lead to a poor performance of the lithographic apparatus as a whole (for example, in terms of the accuracy or consistency with which patterns can be applied to a substrate using that lithographic apparatus).

Correction (i.e. at least partial reduction) of the deformation of the optical elements may be undertaken by mechanically deforming the optical element, or by heating of the optical element. Mechanical correction is limited in terms of the number of locations of or on the optical element where the deformation can be applied, and becomes more complex and costly if such correction by mechanical deformation is desired at a large number of locations (e.g. a number of locations around the optical element, or for a number of locations at different optical elements).

SUMMARY

It is an aspect of the present invention to provide a lithographic apparatus and/or a lithographic method which obviates or mitigates a problem of the prior art, whether identified herein or elsewhere, or to provide an alternative to an existing lithographic apparatus and/or a lithographic method.

According to an aspect of the present invention, there is provided a lithographic apparatus comprising: an illumination system configured to condition a radiation beam; a support constructed to support a patterning device, the patterning device being configured to impart the radiation beam with a pattern in its cross-section to form a patterned radiation beam; a substrate table constructed to hold a substrate; a projection system configured to project the patterned radiation beam onto a target portion of the substrate; and a heater arrangement. The heater arrangement comprises an electron beam generator configured to generate an electron beam, and an electron beam guide arrangement configured to guide the electron beam onto an optical element of the lithographic apparatus. The optical element forms a part of the illumination system or the projection system of the lithographic apparatus which, in use, is traversed by the radiation beam. The heater arrangement is controllable (e.g. by appropriate deflection and/or modulation of the electron beam) to provide a distribution of heat on the optical element by deflection of the electron beam.

A monitor may be part of the heater arrangement and is configured to monitor a deformity characteristic of the optical element, and wherein the heater arrangement further comprises a heater controller configured to estimate the distribution of heat, to be provided on the optical element, based on an output of the monitor. The deformity characteristic may be an interaction between the radiation beam and the optical element or a detected temperature profile or a distortion profile across a surface of the optical element. The interaction may be, for example, a heat distribution on the optical element caused by a radiation beam associated with a dipole or quadrapole illumination mode comprising, respectively, two or four localised regions of high intensity radiation.

The illumination system may be a reflective illumination system, and/or the projection system is a reflective projection system, the optical element comprising a mirror.

The lithographic apparatus, or a part thereof, may be constructed and arranged such that: a beam path of the electron beam between the electron beam generator and optical element is in substantial vacuum (e.g. a gas pressure of about or less than $10^{-3}$ Pa). Alternatively or additionally, the beam path of the electron beam between the electron beam generator and optical element may be through a gas having a pressure of less than about 100 Pa, or less than 10 Pa (e.g. typically 3 Pa).

The radiation beam may comprise radiation having a wavelength in the EUV part of the electromagnetic spectrum, such as a wavelength in the range of 5-20 nm, in the range of 13-14 nm, in the range of 6-7 nm, or in the range of 6.6-6.9 nm.

The distribution of heat on the optical element may, at least in part, be pre-determined.

The distribution of heat on the optical element may, at least in part, be pre-determined from prior knowledge of an interaction between the radiation beam and the optical element (e.g. a distribution of radiation and thus resulting heat on the optical element).

The distribution of heat on the optical element may, at least in part, be determined from a detected temperature profile or a distortion profile across a surface of the optical element.

The heater arrangement may comprise, or be in connection with (e.g. via a communications connection, or a controlling connection), a sensor for detecting a temperature profile or a distortion profile across a surface of the optical element. The sensor may comprise, or be, a camera, or a photodiode.

The lithographic apparatus may further comprise a shield for shielding a cathode of the electron beam generator from positively charged entities.

The electron beam guide arrangement may comprise one or more of a magnetic based deflection arrangement, or an electrostatic based deflection arrangement.

According to an aspect of the present invention, there is provided a lithographic method for use with a lithographic apparatus, the lithographic apparatus comprising: an illumination system configured to condition a radiation beam; a support constructed to support a patterning device, the patterning device being configured to impart the radiation beam with a pattern in its cross-section to form a patterned radiation beam; a substrate table constructed to hold a substrate; a projection system configured to project the patterned radiation beam onto a target portion of the substrate; and a heater arrangement. The heater arrangement comprises an electron beam generator configured to generate an electron beam, and an electron beam guide arrangement configured to guide the electron beam onto an optical element of the lithographic apparatus. The optical element forms a part of the illumination system or the projection system of the lithographic apparatus which, in use, is traversed by the radiation beam. The heater arrangement is controllable to provide a distribution of heat on the optical element by deflection of the electron beam. The method comprises using the heater arrangement to provide the optical element with the distribution of heat in order to reduce a deformity of the optical element that is caused by, or would be caused by, the radiation beam traversing that optical element.

The distribution of heat on the optical element may, at least in part, be pre-determined.

The distribution of heat on the optical element may, at least in part, be pre-determined from prior knowledge of an interaction between the radiation beam and the optical element (e.g. a distribution of radiation and thus resulting heat on the optical element).

The distribution of heat on the optical element may, at least in part, be determined from a detected temperature profile or a distortion profile across a surface of the optical element.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
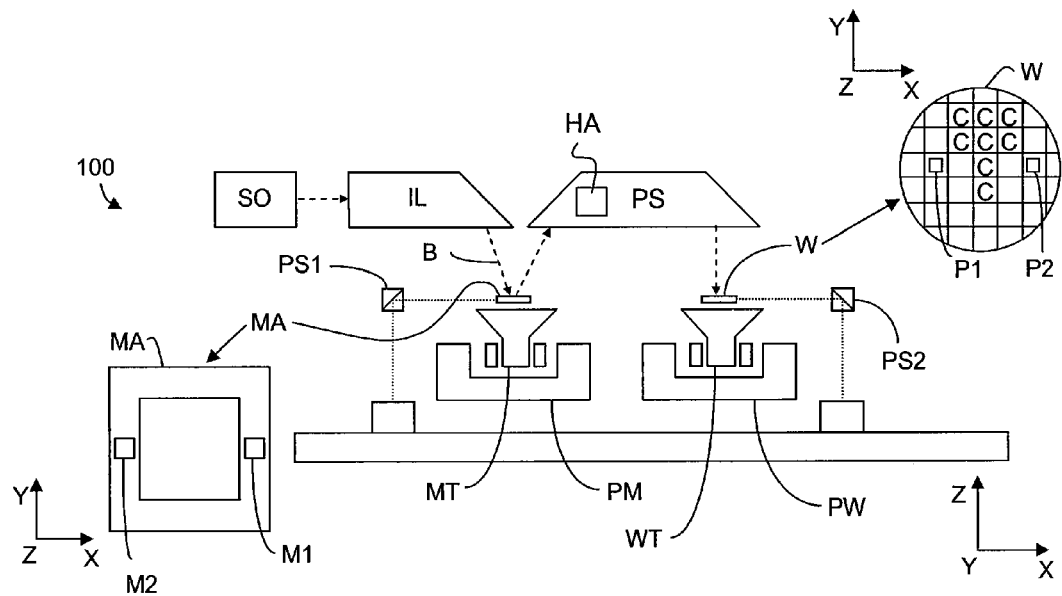
FIG. 1 schematically depicts a lithographic apparatus according to an embodiment of the invention.

FIG. 1 schematically depicts a lithographic apparatus 100 including a source collector module SO according to one embodiment of the invention. The apparatus comprises: an illumination system (sometimes referred to as an illuminator) IL configured to condition a radiation beam B (e.g. EUV radiation); a support structure (e.g. a mask table) MT constructed to support a patterning device (e.g. a mask or a reticle) MA and connected to a first positioner PM configured to accurately position the patterning device MA; a substrate table (e.g. a wafer table) WT constructed to hold a substrate (e.g. a resist-coated wafer) W and connected to a second positioner PW configured to accurately position the substrate W; and a projection system (e.g. a reflective projection system) PS configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device MA, the design of the lithographic apparatus 100, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

The projection system PS is shown as comprising a heater arrangement HA. The heater arrangement HA is used to heat an optical element of the projection system to at least partially correct for (i.e. reduce) deformities of the optical element that would otherwise arise due to the radiation beam traversing that optical element. In other embodiments (not shown) the heater arrangement may alternatively or additionally be located in the illumination system of the lithographic apparatus, or in any other appropriate part of the lithographic apparatus where heating of an optical element is desired to correct for deformities of that optical element due to traversing of that optical element by the radiation beam. Embodiments of the heater arrangement HA will be described in more detail below.

As here depicted, the apparatus is of a reflective type (e.g. employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illumination system IL receives an extreme ultra violet (EUV) radiation beam from the source collector module SO. Methods to produce EUV light include, but are not necessarily limited to, converting a material into a plasma state that has at least one element, e.g., xenon, lithium or tin, with one or more emission lines in the EUV range. In one such method, often termed laser produced plasma (LPP), the plasma can be produced by irradiating a fuel, such as a droplet, stream or cluster of material having the desired line-emitting element, with a laser beam. The source collector module SO may be part of an EUV radiation system including a laser, not shown in FIG. 1, for providing the laser beam exciting the fuel. The resulting plasma emits output radiation, e.g. EUV radiation, which is collected using a radiation collector, disposed in the source collector module. The laser and the source collector module may be separate entities, for example when a $CO_2$ laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illumination system IL may comprise an adjuster for adjusting the angular intensity distribution of the radiation beam B. Generally, at least the outer and/or inner radial extent (commonly referred to as σ-outer and σ-inner, respectively) of the intensity distribution in a pupil plane of the illumination system IL can be adjusted. In addition, the illumination system IL may comprise various other components, such as facetted field and pupil mirror devices. The illumination system may be used to condition the radiation beam, to have a desired uniformity and intensity distribution in its cross-section.

The radiation beam B is incident on the patterning device (e.g. mask) MA, which is held on the support structure (e.g. mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using mask alignment marks M1, M2 and substrate alignment marks P1, P2.

The depicted apparatus could be used in at least one of the following modes:

1. In step mode, the support structure (e.g. mask table) MT and the substrate table WT are kept essentially stationary, while an entire pattern imparted to the radiation beam B is projected onto a target portion C at one time (i.e. a single static exposure). The substrate table WT is then shifted in the X and/or Y direction so that a different target portion C can be exposed.

2. In scan mode, the support structure (e.g. mask table) MT and the substrate table WT are scanned synchronously (e.g. in the X or Y direction) while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
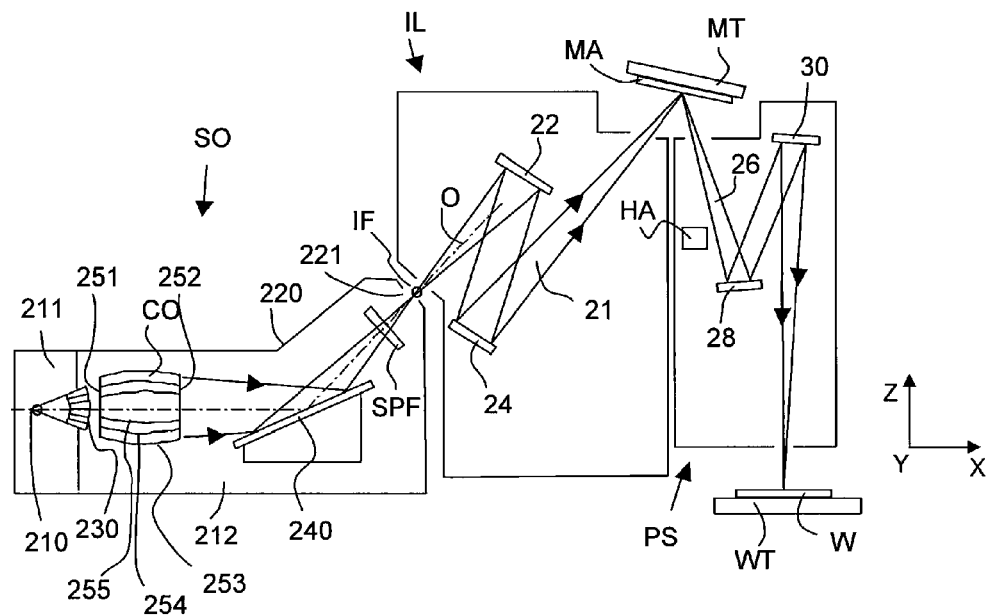
FIG. 2 is a more detailed view of the lithographic apparatus shown in FIG. 1, including a discharge produced plasma (DPP) source collector module SO.

FIG. 2 shows the apparatus 100 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma (DPP) source. EUV radiation may be produced by a gas or vapor, for example Xe gas, Li vapor or Sn vapor in which the (very hot) plasma 210 is created to emit radiation in the EUV range of the electromagnetic spectrum. The (very hot) plasma 210 is created by, for example, an electrical discharge creating an at least partially ionized plasma. Partial pressures of, for example, 10 Pa of Xe, Li, Sn vapor or any other suitable gas or vapor may be used for efficient generation of the radiation. In an embodiment, a plasma of excited tin (Sn) is provided to produce EUV radiation.

The radiation emitted by the plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 212 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF. The virtual source point IF is commonly referred to as the intermediate focus, and the source collector module SO is arranged such that the intermediate focus IF is located at or near an opening 221 in the enclosing structure 220. The virtual source point IF is an image of the radiation emitting plasma 210. Before passing through the opening 221, the radiation may pass through an optional spectral purity filter SPF. In other embodiments, the spectral purity filter SPF may be located in a different part of the lithographic apparatus (e.g. outside of the source collector module SO).

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the wafer stage or substrate table WT.

More elements than shown may generally be present in illumination optics unit IL and projection system PS. The grating spectral filter 240 may optionally be present, depending upon the type of lithographic apparatus. Further, there may be more reflective elements (e.g. mirrors or the like) present than those shown in the Figures, for example there may be 1-6 additional reflective elements present in the projection system PS than shown in FIG. 2.

Collector CO, as illustrated in FIG. 2, is depicted as a nested collector with grazing incidence reflectors 253, 254 and 255, just as an example of a collector (or collector mirror). The grazing incidence reflectors 253, 254 and 255 are disposed axially symmetric around an optical axis O and a collector CO of this type is preferably used in combination with a discharge produced plasma source, often called a DPP source.

Figure 3:
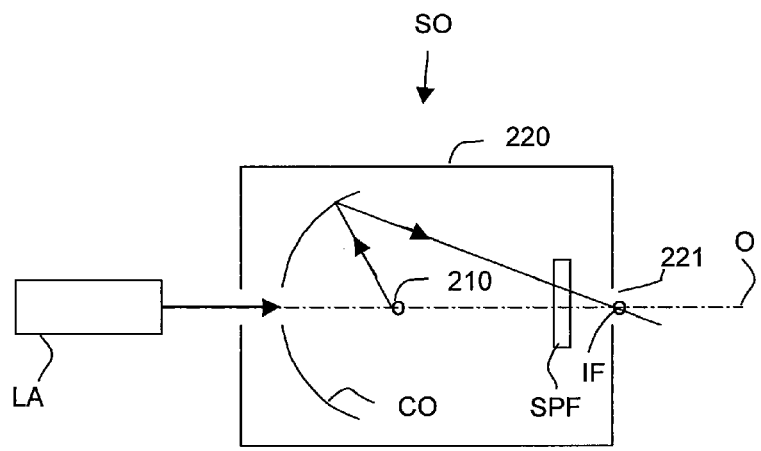
FIG. 3 is a view of an alternative source collector module SO of the apparatus of FIG. 1, the alternative being a laser produced plasma (LPP) source collector module.

Alternatively, the source collector module SO may be part of, comprise or form an LPP radiation system as shown in FIG. 3. Referring to FIG. 3, a laser LA is arranged to deposit laser energy into a fuel, such as a droplet or region or vapor of xenon (Xe), tin (Sn) or lithium (Li), creating the highly ionized plasma 210 with electron temperatures of several 10's of eV. The energetic radiation generated during de-excitation and recombination of these ions is emitted from the plasma 210, collected by a near normal incidence collector CO and focused onto the opening 221 in the enclosing structure 220. Before passing through the opening 221, the radiation may pass through an optional spectral purity filter SPF. In other embodiments, the spectral purity filter SPF may be located in a different part of the lithographic apparatus (e.g. outside of the source collector module SO).

As discussed above, after a radiation beam has been generated it will be conditioned by an illumination system, patterned, and the patterned radiation beam projected onto a substrate by the projection system. An optical element (e.g. a lens or mirror) traversed by the radiation beam (e.g. off which the radiation beam is reflected, or through which the radiation beam is transmitted or refracted) in the lithographic apparatus will become heated, and subsequently deformed by the radiation beam heating the optical element. This optical element may commonly be found in the illumination system or the projection system of the lithographic apparatus. Such deformity of the optical element (or elements) may affect the optical performance of the optical elements, and consequently the performance of the lithographic apparatus as a whole. For this reason at least, it is desirable to at least partially correct (i.e. reduce) the deformity in the optical element.

Correction of a deformity of an optical element caused by heating may be achieved by applying mechanical force to the optical element to counteract the deformity caused by the heating. However, such mechanical force can only be applied at a limited number of locations, and an arrangement for applying this mechanical force may increase rapidly in complexity and cost if the force needs to be applied at a variety of different locations, or at different optical elements. For this reason, it has been proposed to seek an alternative system for correcting for heat induced deformities in optical elements that does not involve or require the direct application of mechanical force. One such system involves the projection of infrared radiation onto the optical element. The infrared radiation can be used to heat, and thus deform the optical element in such a way as to at least partially correct for (i.e. reduce) the initial deformity caused by the radiation beam traversing the optical element, or which would be caused (i.e. in future) by the optical element being traversed by that radiation beam.

An infrared radiation based system may be advantageous in many ways in comparison with the use of a mechanical force deformation system. For example, using an infrared radiation beam, the infrared radiation beam may be directed at one or more of a number of locations on the optical element by appropriate directing of the radiation beam. There is no need to provide a number of complex mechanical actuators disposed around or about the optical element. However, there are also potential disadvantages associated with such a system. For instance, in order to be able to direct the infrared radiation beam, a beam guidance system may be desired. This beam guidance system may, for example, comprise a plurality of mirrors or the like which are individually actuable to be able to accurately direct the infrared radiation beam onto the target portions of the optical element. The need to provide actuators for the mirrors of the infrared radiation based system add potential failure points to the system. Furthermore, the use of infrared radiation may limit the resolution with which a desired heat distribution can be applied to the optical element in question. It is therefore an aspect of the present invention to overcome these potential difficulties and disadvantages, and to provide an improved solution to the potential problem of heat induced deformities in optical elements.

Figure 4:
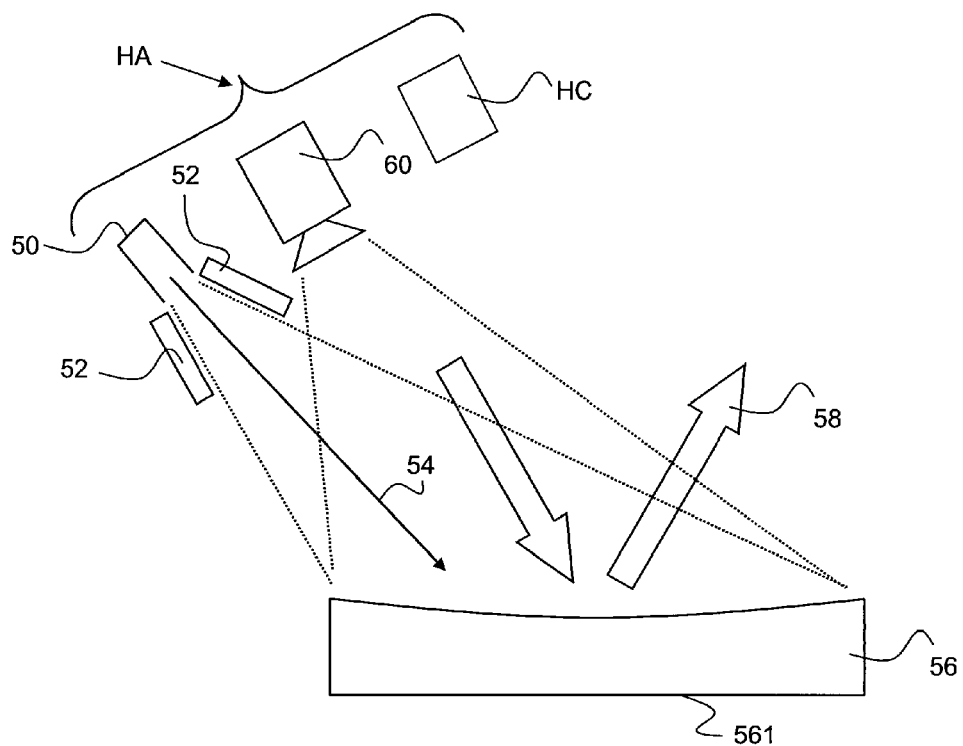
FIG. 4 schematically depicts a heater arrangement in accordance with an embodiment of the present invention.

According to an embodiment of the present invention, there is provided a lithographic apparatus, such as for example the lithographic apparatus described above in relation to FIGS. 1 to 3. For instance, the lithographic apparatus may comprise an illumination system configured to condition a radiation beam. A support may be provided that is constructed to support to a patterning device, the patterning device being capable of imparting the radiation beam with a pattern in its cross-section to form a patterned radiation beam. A substrate table is also provided and constructed to hold a substrate. The apparatus further comprises a projection system configured to project the patterned radiation beam onto a target portion of the substrate. The lithographic apparatus includes a heater arrangement which is schematically depicted in FIG. 4. The heater arrangement HA comprises an electron beam generator 50 configured to generate an electron beam, and an electron beam guide arrangement 52 for guiding the electron beam onto an optical element 56 of the lithographic apparatus. As discussed above, the optical element in question may form a part of the illumination system or the projection system of the lithographic apparatus which, in use, is traversed by the radiation beam. The heater arrangement HA is controllable to provide a desired distribution of heat on the optical element 56 by deflection of the electron beam (e.g. by magnetic deflection, or by electrostatic deflection). The heater arrangement HA may comprise a heater controller HC, as shown in FIG. 4. The heater controller HC is constructed and arranged to provide to the heater HA an electron beam control signal. The control signal controls a spatial distribution of electron beam intensity at the optical element which in turn provides said desired distribution of heat on the optical element. The control signal may, for example, include a steering signal for the electron beam generator 50 to control a current of a scanning electron beam 54, and a steering signal for the electron beam guide arrangement 52 to control a corresponding scanning deflection of the electron beam. As a result of a plurality of scanning deflections an effective spatial distribution of electron beam intensity at the optical element is provided by the scanning electron beam. The heater controller HC is configured to estimate the desired distribution of heat to be provided on the optical element and which will cause a desired thermal expansion of the optical element, to counteract the deformity of the optical element that is, or will be, caused by the radiation beam traversing that optical element. This deformity may be characterized by a deformity characteristic of the optical element. The deformity characteristic may for example be or include an interaction between the radiation beam 58 and the optical element 56, or a detected temperature profile across a surface of the optical element, or a detected distortion profile across the surface of the optical element, as explained below. A monitor 60 may be part of the heater arrangement HA and is configured to monitor a deformity characteristic as mentioned above. The estimate of the desired distribution of heat to be provided on the optical element may be based on an output of the monitor 60. Such a desired distribution of heat can alternatively or additionally be used to change the shape of the optical element, by deformation by heating.

One potential advantage of embodiments of the present invention is that the electron beam may be guided magnetically or electrostatically, and thus requires no moving parts in order to undertake such guidance. This removes potential failure points that might otherwise be associated with guide arrangements that require moving parts, and may also lead to a reduction in contamination that may be caused by repeated movement and thus wear of such moving parts. Furthermore, the use of an electron beam means that there is no interaction between the heating beam and the radiation beam that is used to apply patterns to a substrate. More importantly, perhaps, is that the electrons will not traverse the optical component and thus will not be directed towards and be incident upon the substrate and negatively affect a pattern applied to that substrate. In contrast, in infrared based systems the infrared radiation might traverse the optical component and thus will be directed towards and be incident upon the substrate and negatively affect a pattern applied to that substrate. Additionally, the use of an electron beam means that a desired heat distribution can be applied to the optical element with a high resolution, and potentially higher than that of an infrared radiation based system. A further, and by no means less valuable, potential advantage of embodiments of the present invention is that readily available and existing technology can be used to form the heater arrangement, such as for example electron beam generators and guide arrangements used in cathode ray tubes in the television industry, or in the oscilloscope industry. This means that embodiments the present invention can be implemented using mature technology, with desired substantial vacuum or low pressure compatibility beam path specifications, which may result in a potentially low cost, low maintenance and highly reliable solution to the potential disadvantages of alternative systems discussed above.

Figure 5:
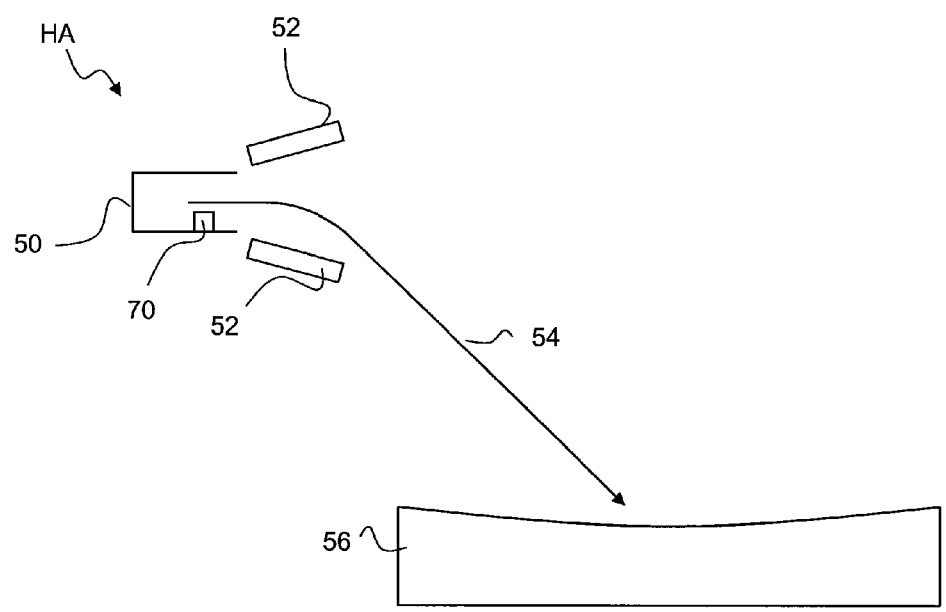
FIG. 5 schematically depicts a heater arrangement in accordance with an embodiment of the present invention.

Embodiments of the present invention will now be described by way of example only with reference to FIGS. 4 and 5. The Figures are not drawn to any particular scale. Like features appearing in different Figures are given the same reference numerals for clarity and consistency.

FIG. 4 schematically depicts a heater arrangement HA which may be used in a lithographic apparatus, for example one or more of the lithographic apparatus described above in relation to FIGS. 1 to 3. The heater arrangement HA comprises an electron beam generator 50. The heater arrangement HA further comprises an electron beam guide arrangement 52 for guiding an electron beam 54 generated by the electron beam generator 50 onto an optical element 56 of the lithographic apparatus.

In this embodiment, the optical element 56 is a mirror (i.e. a reflective optical element such as, for example, element 22, or 24, or 28 or 30 in FIG. 2). In other embodiments, the optical element may be a lens (i.e. a transmissive optical element). The heater arrangement HA may have a particularly suitable use in conjunction with optical elements of an EUV lithographic apparatus. For instance, electron beams cannot readily pass through a gaseous environment. For this reason, it is usual to use electron beams (and thus the heater arrangement HA) in environments where the beam path of the electron beam is in a substantial vacuum (e.g. a gas pressure of about or less than $10^{-3}$ Pa) or through a gas pressure of less than about 100 Pa, or less than 10 Pa (e.g. typically 3 Pa). Somewhat coincidentally, similar conditions are to be found in an EUV lithographic apparatus, where an EUV radiation beam also has a beam path which is in a substantial vacuum or through a gas having a pressure of less than 10 Pa (e.g. typically 3 Pa), and for which the optical elements are reflective (EUV being absorbed by transmissive lenses or the like). Radiation used in an EUV lithographic apparatus to apply pattern to a substrate may be in the range of 5-10 nm, in the range of 13-14 nm, in the range of 6-7 nm, or in the range of 6.6-6.9 nm.

A lithographic apparatus (EUV or otherwise), or an appropriate part thereof, of which the heater arrangement HA forms a part may thus be constructed and arranged such that a beam path of the electron beam 54 between the electron beam generator 50 and the optical element 56 is in a substantial vacuum, or through a gas having a pressure of less than about 100 Pa, or less than 10 Pa (e.g. typically 3 Pa). This may be achieved by appropriately controlling the atmosphere within one or more parts of the lithographic apparatus.

Referring back to FIG. 4, the heater arrangement HA is controllable to provide a desired distribution of heat to or on the surface of the optical element 56 by deflection of the electron beam 54 across the surface of that optical element 56, and by modulation of a current of the electron beam 54 (which corresponds to the instantaneously amount of energy provided on, or dumped on, a part of the optical element 56). The optical element 56 is (or will be) provided with the desired distribution of heat in order to reduce a deformity (i.e. at least partially correct for a deformity) of the optical element 56 that is caused by, or would be caused by, a radiation beam 58 (e.g. an EUV radiation beam) traversing that optical element 56.

The desired distribution of heat on the optical element 56 may be, at least in part, pre-determined. For example, the desired distribution of heat on the optical element 56 may, at least in part, be pre-determined from prior knowledge of an interaction between the radiation beam 58 and the optical element 56. This interaction may be a heat distribution on the optical element 56 caused by the radiation beam 58 being incident upon and at least partially absorbed by the optical element 56. For example, the radiation beam 58 may be incident upon the optical element 56 in the form of a dipole or quadrapole illumination mode comprising, respectively, two or four localised regions of high intensity radiation, and thus two or four localised regions of high intensity heat distribution. Such localized high intensity heat distribution may cause exaggerated deformity of the optical element 56. This deformity can be at least partially corrected for by heating other areas of the optical element, either before or during the time for which the radiation beam 58 is incident upon the optical element 56. In this manner, a feed-forward method of operation is established. This feed-forward method can be undertaken in real time, such that the distribution of heat of the optical element 56, as provided by the heater arrangement HA, can be changed to take into account changing exposure conditions already known in advance, such as for example the application of different patterns on to the substrate, or changes in the intensity distribution of the radiation beam traversing the optical element. The changes of the distribution of heat of the optical element 56 can be undertaken during a scanning exposure of the substrate W, or during a static exposure of the substrate W.

The desired distribution of heat on the optical element 56 may, alternatively or additionally, at least in part, be determined from a detected temperature profile or a distortion profile across the surface of the optical element 56. For instance, the monitor 60 of the heater arrangement HA may be embodied as a sensor 60 for detecting a temperature profile or a distortion profile across a surface of the optical element 56. The sensor 60 may detect changes in temperature across the surface of the optical element 56, or changes in the spacing of alignment marks or the like on the optical element 56 which can be indicative of distortion of the optical element 56 and of corresponding changes in temperature of that element 56. The sensor 60 may be, or comprise, a camera or a photodiode, or the like. For example, the sensor 60 may be or comprise a thermal imaging camera for temperature measurement, and/or an imaging camera for measuring distortions of the radiation beam (e.g. an EUV imaging camera, if the radiation beam comprises EUV radiation). Alternatively, the sensor 60 may comprise a plurality of buried temperature sensors disposed in a corresponding plurality of bores protruding into the substrate from a backside 561 of the optical element 56 as illustrated in FIG. 4. Each bore includes a temperature sensor at the end of the bore facing the EUV reflective surface of the substrate 56. These temperature sensors are arranged to provide a signal representing a map of the mirror surface temperature. This signal may be outputted by the sensor 60 and serve as a basis for an estimate of the heat distribution to be provided by the heater arrangement HA.

An at least partial determination of the desired distribution of heat on the optical element 56 from a detected temperature profile or a distortion profile across a surface of the optical element 56 constitutes a feed-back method of operation. The feed-back method can be used to detect for and make desired corrections in the feed-forward method described above.

In use, the heater arrangement HA may be controlled by using pre-determined information, or information obtained from subsequent sensing, to guide the radiation beam 54 to one or more of various appropriate locations on the optical element 56 by appropriate actuation of the guide arrangement 52. As with conventional cathode-ray tube technology, the guiding arrangement 52 may be or comprise a magnetic based deflection arrangement, or an electrostatic based defection arrangement, for example one or more magnetic coils, or electrostatic plates or the like. For instance, using existing technology used in oscilloscopes, the heater arrangement HA may provide an electron beam 54 with electrons having an energy of around 2 keV. In combination with beam currents of 10 mA or less, this may be amply sufficient for heating of the optical element, but not to be so high to require a high voltage power system, and the cost that is associated with such a system and constituent electronics. Furthermore, in terms of electron beams, 2 kV is a relatively low voltage, which avoids high voltage problems that become ever more pressing at voltages beyond 10 kV. Moreover, in terms of electron beams 2 keV is a relatively low energy, which allows electrostatics to be used as the guide arrangement 52 and may be cheaper and less complex than a magnetic coil arrangement.

In use, and even if used in a substantial vacuum, the electron beam may be incident upon gas atoms or molecules or the like and may result in the generation of positively charged entities (e.g. positive ions). These positive ions, if influenced by an electric field generated by the electron beam generator, may be accelerated towards a negatively charged cathode of the electron beam generator and may cause damage to the cathode. This is undesirable. FIG. 5 shows that this potential problem can be overcome by the incorporation of a shield 70. This shield 70 may, for example, be used in combination with orientation of the electron beam generator 50. The shield 70 is only depicted schematically in the Figure. The shield 70 may comprise one or more grids, plates, screens or the like, and/or may be part of one or more lenses or the like of the electron beam generator 50.

The electron beam, when travelling through a gas, may generate ions or radicals (e.g. hydrogen radicals, if hydrogen is present). These ions or radicals may cleanse surfaces of optical elements within the lithographic apparatus, and may, at least to some extent, be beneficial.

In one example, the electron beam generator may comprise parts as used in electron guns for cathode ray tubes or oscilloscopes, i.e. an electrically indirectly heated cathode, a triode section, a pre-focus section and a main lens. In order to prevent potential cathode damage by ion bombardment when operating the device at, for example, a gad pressure of less than 100 Pa, preferably the cathode—triode part of the electron beam generator may comprise a shield to block or deflect the (positive) ions on their way towards the cathode, but still enable the electrons to be accelerated towards the pre-focus section and main lens.

As discussed above, the above-mentioned apparatus and method may find use in any suitable lithographic apparatus where heating of an optical element is desired. The above-mentioned apparatus and method may find use preferable use in a projection system of a lithographic apparatus, where it is desirable to be able to minimize any deformities of the optical elements in that projection system, thus minimizing any errors in the application of patterns provided on the substrate that would otherwise be caused by those deformities. The use of an electron beam may, as discussed above, impose certain restrictions on the environment through which the electron beam passes, again as discussed above. Some forms of lithographic apparatus, such as for example EUV lithographic apparatus need to be constructed and arranged to ensure that the EUV radiation beam path is subjected to the same or similar conditions to that of an electron beam path. Thus, there may be some synergy in the use of an electron beam arrangement in an EUV lithographic apparatus, where the optical element will typically be reflective, and the beam path for both the radiation beam and the electron beam of the heater arrangement will be in a substantial vacuum, or an environment where the gas pressure is less than about 100 Pa, or less than 10 Pa.

The embodiments described above have been described as being used to reduce or correct for a deformity of the optical element. This might alternatively or additionally be described as being used to reduce or correct for an effect of a deformity of the optical element (e.g. a distortion of one sort or another in the radiation beam that traverses the optical element). This reduction or correction may vary depending on many factors, such as for example a heat distribution across the optical element due to the traversing of the radiation beam, and also other factors such as for example the time available for heating the optical element using the electron beam.

In some examples, the heating of the optical element using the electron beam may be in a global sense, possibly to ensure that the expansion of the optical element due to heating is more global, thus reducing any deformities that would be caused by more localized heating caused by a localized intensity distribution of a radiation beam traversing the optical element. For instance, heating of the optical element using the electron beam may be undertaken at locations remote from locations where the radiation beam is or will be incident. In another example, the heating using the electron beam may be more localised. For instance, heating of the optical element using the electron beam may be undertaken at locations adjacent to or even overlapping locations where the radiation beam is or will be incident. In summary, the desired heating using the electron beam may vary depending on the application, and the desired heating may be determined from modelling, trial and error, or experimentation, or the like.

The electron beam may be used to increase the temperature of an optical element to its working temperature, or working temperature profile, which is above the temperature of the surroundings and/or an arrangement used to hold or suspend the optical element. In steady state the energy that is dumped/provided by the electron beam into/onto the optical element equals the energy loss due to radiation and conduction towards the surroundings and/or arrangement used to hold or suspend the optical element, and the optical element then has its optimal shape for imaging. By switching on the radiation beam used by the lithographic apparatus (e.g. an EUV beam), an extra amount of energy (possibly with a spatial pattern) is absorbed by the optical element. By reducing the amount of energy dumped by the electron beam (with the same spatial pattern as the radiation beam used by the lithographic apparatus) the total absorbed amount of energy (both for the whole optical element, or locally on the optical element) can be kept constant. Thus, the shape of the optical element remains stable at its optimum shape, resulting in good imaging.

In another example, it may be known the optical element has an imperfect, undesired, or incorrect shape (e.g. from inspection prior to installation, or from detection in-situ by a sensor). The shape can be corrected for by deliberately imposing on the optical element a temperature profile which distorts the optical element in such a way that the temperature profile results in the optical element having a desired, perfect or correct shape.

In the above-described examples, a single electron beam arrangement has been described, with a single electron beam. In other examples, the lithographic apparatus may comprise a plurality or electron beam generators or heater arrangements for use in heating one or more (e.g. a plurality of) optical elements. In another example, a single electron beam generator may be used to heat one or more optical elements, or regions of those elements, by guidance of an electron beam.

Although specific reference may be made in this text to the use of lithographic apparatus in the manufacture of IC devices, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

What is claimed is:

1. A lithographic apparatus comprising:
   an illumination system configured to condition a radiation beam;
   a support constructed to support a patterning device, the patterning device configured to impart the radiation beam with a pattern in its cross-section to form a patterned radiation beam;
   a substrate table constructed to hold a substrate;
   a projection system configured to project the patterned radiation beam onto a target portion of the substrate; and
   a heater arrangement comprising an electron beam generator configured to generate an electron beam, and an electron beam guide arrangement configured to guide the electron beam onto an optical element of the lithographic apparatus,
   the optical element forming a part of the illumination system or the projection system of the lithographic apparatus which, in use, is traversed by the radiation beam,
   the heater arrangement being controllable to provide a distribution of heat on the optical element by deflection of the electron beam.

2. The lithographic apparatus of claim 1, wherein the heater arrangement comprises a monitor configured to monitor a deformity characteristic of the optical element, and wherein the heater arrangement further comprises a heater controller configured to estimate the distribution of heat to be provided on the optical element based on an output of the monitor.

3. The lithographic apparatus of claim 2, wherein the distribution of heat on the optical element is, at least in part, pre-determined.

4. The lithographic apparatus of claim 2, wherein the deformity characteristic is an interaction between the radiation beam and the optical element.

5. The lithographic apparatus of claim 2, wherein the deformity characteristic is a detected temperature profile or a distortion profile across a surface of the optical element.

6. The lithographic apparatus of claim 2, wherein the monitor is a sensor configured to detect a temperature profile or a distortion profile across a surface of the optical element.

7. The lithographic apparatus of claim 6, wherein the sensor comprises a camera, or a photodiode.

8. The lithographic apparatus of claim 1, further comprising a shield configured to shield a cathode of the electron beam generator from positively charged entities.

9. The lithographic apparatus of claim 1, wherein the electron beam guide arrangement comprises a magnetic based deflection arrangement, or an electrostatic based deflection arrangement, or both a magnetic based deflection arrangement and an electrostatic based deflection arrangement.

10. The lithographic apparatus of claim 1, wherein the illumination system is a reflective illumination system, and/or the projection system is a reflective projection system, and wherein the optical element comprises a mirror.

11. The lithographic apparatus of claim 1, wherein the electron beam has a beam path between the electron beam generator and the optical element, and wherein the lithographic apparatus, or a part thereof, is constructed and arranged such that:
   the beam path is in substantial vacuum; and/or
   the beam path is through a gas having a pressure of less than about 100 Pa.

12. The lithographic apparatus according to claim 11, wherein the radiation beam comprises radiation having a wavelength in the EUV part of the electromagnetic spectrum, the wavelength being in the range of 5-20 nm.

13. A lithographic method for use with a lithographic apparatus, the lithographic apparatus comprising
   an illumination system configured to condition a radiation beam;
   a support constructed to support a patterning device, the patterning device configured to impart the radiation beam with a pattern in its cross-section to form a patterned radiation beam;
   a substrate table constructed to hold a substrate;
   a projection system configured to project the patterned radiation beam onto a target portion of the substrate; and
   a heater arrangement comprising an electron beam generator configured to generate an electron beam, and an electron beam guide arrangement configured to guide the electron beam onto an optical element of the lithographic apparatus,
   the optical element forming a part of the illumination system or the projection system of the lithographic apparatus which, in use, is traversed by the radiation beam,
   the heater arrangement being controllable to provide a distribution of heat on the optical element by deflection of the electron beam,
   the method comprising:
   using the heater arrangement to provide the optical element with the distribution of heat in order to reduce a deformity of the optical element that is caused by, or would be caused by, the radiation beam traversing that optical element.

14. The lithographic method of claim 13, wherein the distribution of heat on the optical element is, at least in part, pre-determined.

15. The lithographic method of claim 14, wherein the distribution of heat on the optical element is, at least in part, pre-determined from prior knowledge of an interaction between the radiation beam and the optical element.

* * * * *